United States Patent [19]
Gleichert

[11] Patent Number: 5,229,769
[45] Date of Patent: Jul. 20, 1993

[54] METHOD AND CIRCUIT FOR PERFORMING RUNNING DISPARITY MEASUREMENTS

[75] Inventor: Marc Gleichert, San Jose, Calif.

[73] Assignee: Advanced Micro Devices, Inc., Sunnyvale, Calif.

[21] Appl. No.: 839,602

[22] Filed: Feb. 21, 1992

[51] Int. Cl.[5] ............................................. H03M 5/00
[52] U.S. Cl. ........................................ 341/58; 341/94; 375/19
[58] Field of Search ................. 341/50, 58, 94; 375/19

[56] References Cited

U.S. PATENT DOCUMENTS

| | | | |
|---|---|---|---|
| 4,547,890 | 10/1985 | Gindi | 375/19 |
| 4,975,916 | 12/1990 | Miracle et al. | 371/47.1 |
| 5,025,256 | 6/1991 | Stevens | 341/59 |
| 5,144,304 | 9/1992 | McMahon et al. | 341/58 |

Primary Examiner—Marc S. Hoff
Attorney, Agent, or Firm—Gerald Fisher

[57] ABSTRACT

A running disparity circuit for 8B/10B decoding which reduces power consumption and substantially reduces the number of gates and the required silicon area by employing a combination of state type devices and combinatorial logic instead of combinatorial devices exclusively.

9 Claims, 4 Drawing Sheets

FIG.1
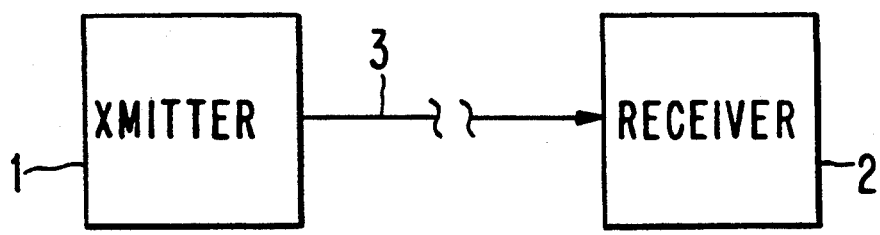
FIG.2
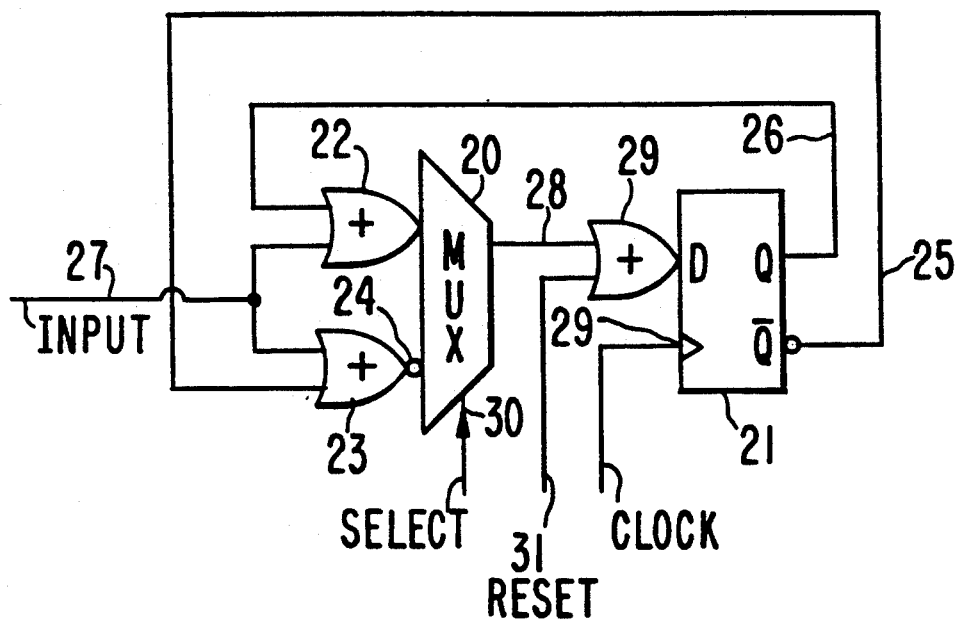
FIG.3
| SELECT | INPUT | CURRENT Q | NEXT Q |
|--------|-------|-----------|--------|
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 0 |

| #1's | A | B | C | LBSD | 5B/6BH | PDSP | DSPAFT | DSPERR |
|---|---|---|---|---|---|---|---|---|
| 0' | 1 | 1 | 1 | 0000011 1 | 0011001 1 | 0101000 1 | 00000000 | 11111011 |
| 1' | 0 | 1 | 1 | 0000111 1 | 0011001 1 | 0101010 1 | 00000100 | 10110010 0 |
| 2' | 0 | 0 | 1 | 0000111 1 | 0011001 1 | 0101010 1 | 01001101 | 00100100 0 |
| 3' | 0 | 0 | 0 | 0000111 1 | 0011001 1 | 0101010 1 | 11011111 | 01001101 |
| 4' | 1 | 0 | 0 | 0000111 1 | 0011001 1 | 0101010 0 | 11111111 | 11011111 |
| 5' | 1 | 1 | 0 | 0000111 1 | 0011001 1 | 0101010 1 | 11111111 | 11111111 |

FIG.6

METHOD AND CIRCUIT FOR PERFORMING
RUNNING DISPARITY MEASUREMENTS

FIELD OF THE INVENTION

The invention relates to methods and apparatus for encoding/decoding and particularly for determining running disparity and for flagging disparity error.

BACKGROUND OF THE INVENTION

Many high speed communication systems and networks have employed binary encoding techniques of data to provide a DC-balanced transmission. Serially transmitted binary data that has a preferably zero DC component simplifies design and reliability of transmitter and receiver systems. The so called 8B/10B code is one type of encoding which has become a standard for several high data rate applications. This code is described in an article by Franaszek et al entitled, "A DC-Balanced partitioned-Block, 8B/10B Transmission Code," *IBM Journal of Research and Development*, Volume 27, 1983, pages 440–451 and U.S. Pat. No. 4,486,739.

In 8B/10B coding, a serial data stream made of 8 bit data packets is encoded to 10 bits of serial transmitted code. The two added bits provide DC balance and enough transitions to assure accurate phase lock loop oscillator clock synchronization as well as other purposes. In fact, 8B/10B coding is usually carried out in two packets, a 5B/6B nibble and 3B/4B nibble. In other words, each $D_0 \ldots D_7$ 8 bit byte to be encoded is broken up into 5 bits $D_0 \ldots D_4$ which are encoded into 6 bits and 3 bits, $D_5 \ldots D_7$, which are encoded into 4 bits. The 8B/10B coding scheme is somewhat complex and is best understood by reference to the Tables I and II below given by Franaszek. All the possible 5 bit data values are listed in column labeled "ABCDE" and the corresponding 6 bit code is shown in the column labeled "abcdei."

The term "running disparity" is employed in the prior art as a measure of the DC balance of the encoded data. Specifically, the running disparity is the sum of the disparity of all preceding blocks, where disparity is the difference between the number of zeros and the number of ones in a block. For a given block of 8B/10B coded data, valid code is selected such that the disparity can be either +2, −2 or 0. With reference to Table 1, under column abcdei, note that each code in that column is selected so that the number of ones and zeroes are either equal or differ by an even number. Also, with reference to the column in Table 1 labeled "alternate" and the column labeled "D-1," note that wherever a "+" appears in column D-1, that the number of zeroes exceeds the number of ones by two in the corresponding code in column "abcdei." Also note that for each "+," there appears an entry in the column "ALTERNATE" which is the complement of the binary code in column "abcdei."

The same characteristics are noted for the 3B/4B encoding as shown in the corresponding column labeled "fghi" in Table 2.

One of the features of the 8B/10B codes using the disparity concept described above is that it is convenient to sum the disparity, i.e., +2, 0, or −2, for all bytes while coding the data and if the disparity is positive, then to arrange the logic so that the disparity for the next coded data block to be sent will be negative. For example, to accomplish this, after examining a code block, if the disparity of that block is positive at +2 and the running disparity is positive at +1, then the ALTERNATE code for that block is automatically selected so that the running disparity after the next block is sent will be decremented by −2 so that the running disparity will be negative at −1.

It is also noted that there are codes in Tables 1 and 2 labeled "x" in column D-1 where the number of zeroes and ones are equal. These blocks have disparity equal to "0" and have no ALTERNATE codes because they have no effect on the running disparity.

Circuitry is employed in the receivers of the prior art to verify that the data had been properly encoded, and that no error was introduced in the transmission. Part of this verification is to check that each block complies with the disparity rules, namely, that it is +2, 0, or −2 and that the running disparity is either −1 or +1.

In the prior art receivers, this disparity verification is carried out by combinatorial logic. Because each of the ten bits in the 8B/10B code needs to be evaluated to decode the incoming 10B code, a large number of gates on the order of 100 and a large amount of silicon space were required.

It is the object of this invention to simplify the running disparity verification circuit and to substantially reduce the number of gates and the silicon area required for these functions.

SUMMARY OF THE INVENTION

The above mentioned object is achieved in an integrated circuit by employing a state type device providing intermediate logic signals to a combinatorial logic circuit.

Another object is to substantially reduce the power consumption and silicon area.

TABLE 1

5B/6B ENCODING

| NAME | ABCDE | K | D-1 | abcdei | DI | abcdei ALTERNATE |
|---|---|---|---|---|---|---|
| D.0 | 00000 | 0 | + | 011000 | − | 100111 |
| D.1 | 10000 | 0 | + | 100010 | − | 011101 |
| D.2 | 01000 | 0 | + | 010010 | − | 101101 |
| D.3 | 11000 | 0 | x | 110001 | 0 | |
| D.4 | 00100 | 0 | + | 001010 | − | 110101 |
| D.5 | 10100 | 0 | x | 101001 | 0 | |
| D.6 | 01100 | 0 | x | 011001 | 0 | |
| D.7 | 11100 | 0 | − | 111000 | 0 | 000111 |
| D.8 | 00010 | 0 | + | 000110 | − | 111001 |
| D.9 | 10010 | 0 | x | 100101 | 0 | |
| D.10 | 01010 | 0 | x | 010101 | 0 | |
| D.11 | 11010 | 0 | x | 110100 | 0 | |
| D.12 | 00110 | 0 | x | 001101 | 0 | |
| D.13 | 10110 | 0 | x | 101100 | 0 | |
| D.14 | 01110 | 0 | x | 011100 | 0 | |
| D.15 | 11110 | 0 | + | 101000 | − | 010111 |
| D.16 | 00001 | 0 | − | 011011 | + | 100100 |
| D.17 | 10001 | 0 | x | 100011 | 0 | |
| D.18 | 01001 | 0 | x | 010011 | 0 | |
| D.19 | 11001 | 0 | x | 110010 | 0 | |
| D.20 | 00101 | 0 | x | 001011 | 0 | |
| D.21 | 10101 | 0 | x | 101010 | 0 | |
| D.22 | 01101 | 0 | x | 011010 | 0 | |
| D/K.23 | 11101 | x | − | 111010 | + | 000101 |
| D.24 | 00011 | 0 | + | 001100 | − | 110011 |
| D.25 | 10011 | 0 | x | 100110 | 0 | |
| D.26 | 01011 | 0 | x | 010110 | 0 | |
| D/K.27 | 11011 | x | − | 110110 | + | 001001 |
| D.28 | 00111 | 0 | x | 001110 | 0 | |
| K.28 | 00111 | 1 | − | 001111 | + | 110000 |
| D/K.29 | 10111 | x | − | 101110 | + | 010001 |
| D/K.30 | 01111 | x | − | 011110 | + | 100001 |
| D.31 | 11111 | 0 | − | 101011 | + | 010100 |

TABLE 2

3B/4B ENCODING

| NAME | FGH | K | D-1 | fghj | DI | fghj ALTERNATE |
|---|---|---|---|---|---|---|
| D/K.x.0 | 000 | x | + | 0100 | — | 1011 |
| D.x.1 | 100 | 0 | x | 1001 | 0 | |
| D.x.2 | 010 | 0 | x | 0101 | 0 | |
| D/K.x.3 | 110 | x | — | 1100 | 0 | 0011 |
| D/K.x.4 | 001 | x | + | 0010 | — | 1101 |
| D.x.5 | 101 | 0 | x | 1010 | 0 | |
| D.x.6 | 011 | 0 | x | 0110 | 0 | |
| D.x.P7 | 111 | 0 | — | 1110 | + | 0001 |
| D/K.y.A7 | 111 | x | — | 0111 | + | 1000 |
| K.28.1 | 100 | 1 | + | 1001 | 0 | 0110 |
| K.28.2 | 010 | 1 | + | 0101 | 0 | 1010 |
| K.28.5 | 101 | 1 | + | 1010 | 0 | 0101 |
| K.28.6 | 011 | 1 | + | 0110 | 0 | 1001 |

Note:
K.x Restricted to K.28
K.y Restricted to K.23, K.27, K.28, K.29, K.30

BRIEF DESCRIPTION OF THE DRAWINGS

FIG. 1 is a general block diagram of the communication system.

FIG. 2 is a schematic of a state machine building block of the invention.

FIG. 3 is the truth table for the state machine of FIG. 2.

FIG. 6 is the truth table for the circuits of FIG. 4 and FIG. 5.

DETAILED DESCRIPTION OF THE INVENTION

Figure 4:
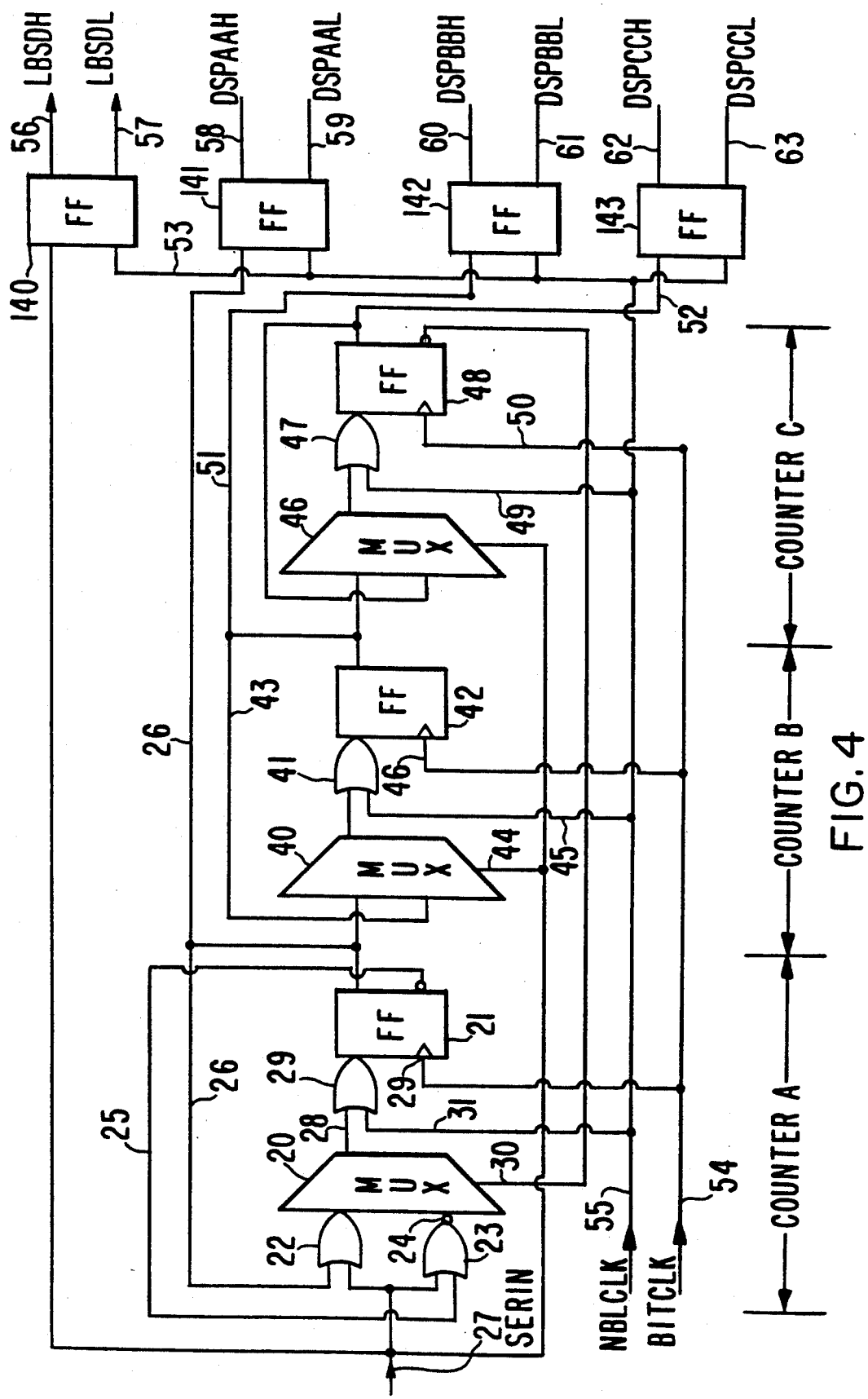
FIG. 4 is a schematic of a Johnson type counter employing state device building blocks for providing intermediate output to the combinatorial logic of FIG. 5.

With reference to FIG. 1, a transmitter 1 sends high data rate serial data encoded in 8B/10B over a serial link 3, such as an optical fiber or coax medium, to a receiver 2. In the receiver 2, the running disparity verification circuitry needs to ascertain that each nibble, the 5B/6B or 3B/4B, of the 8B/10B incoming serial data via link 3 meets the disparity condition, i.e., that the number of ones and zeroes are either equal in number or differ by two and that the running disparity is −1 or +1. If these two conditions are not complied with, the disparity circuit needs to issue a disparity error (DSPERR) flag.

To understand my implementation, it si first necessary to understand the logical function of one portion of my circuit. In FIG. 2, is disclosed a circuit employing a multiplexor 20 (MUX) coupled via line 28 through OR gates 29 to a flip flop 21 input D.

Flip flop 21 Q output is connected back to MUX 20 via line 26 through OR gate 22. The $\overline{Q}$ output of flip flop 21 is connected to MUX 20 via line 25 through OR gate 23. OR gate 23 is coupled to the bottom input of the MUX 20 through inverter 24 and OR gate 22 is coupled directly to the top input of MUX 20. The input 27 is coupled to a second input of both OR gate 22 and 23. At the end of each nibble, FF21 is reset by a high on reset 31. A logical one (high) on the select line 30 of MUX 20 causes the MUX to output the logical level of its top input from OR gate 22 on line 28. A logical zero on select line 30, selects the lower input from OR gate 23 to output line 28. FIG. 3 is the truth table for the circuit FIG. 2. The logical equation which defines this circuit is as follows: Next Q=[SELECT($\overline{INPUT}$·current Q)+$\overline{SELECT}$ (INPUT+current Q)]+Reset FIG. 4 discloses a schematic of a Johnson-style counter which couples together the logical unit of FIG. 2, counter stage A, and two additional state device stages, counter stages B and C. Each of these counter stages employ a MUX, OR gate and, flip flop. This Johnson counter examines each bit of a SERIN data nibble which arrive on line 27 and counter stages B and C only take data in from the previous stage and advance to the next state when SERIN is a "1". At the end of each nibble, the state of counter stages A, B, and C on 26, 51, and 52 are latched respectively in flip flops 141, 142, and 143 at occurrence of the clock pulse 54, and the last bit of the serial data nibble is latched in flip flop (LBSD) FF140 on the occurrence of the nibble clock pulse 55. At this time, each counter stage is reset to '1' for the next nibble. The last bit is latched to eliminate the uncertainty of race conditions in the counter. These four flip flops 140, 141, 142, 143 latch the state of LBSD and counter stages A, B, and C which are subsequently evaluated in the combinatorial logic circuit of FIG. 5 to derive the running disparity after nibble called "ADSP" and the flag indicating a disparity error called "DSPERR." The NBLCLK signal 55 are BITSLK signal 54 are derived in standard timing circuits which are not shown. The nibble clock pulse is coincident with the start of the first bit in the next nibble and is one clock bit long.

Figure 5:
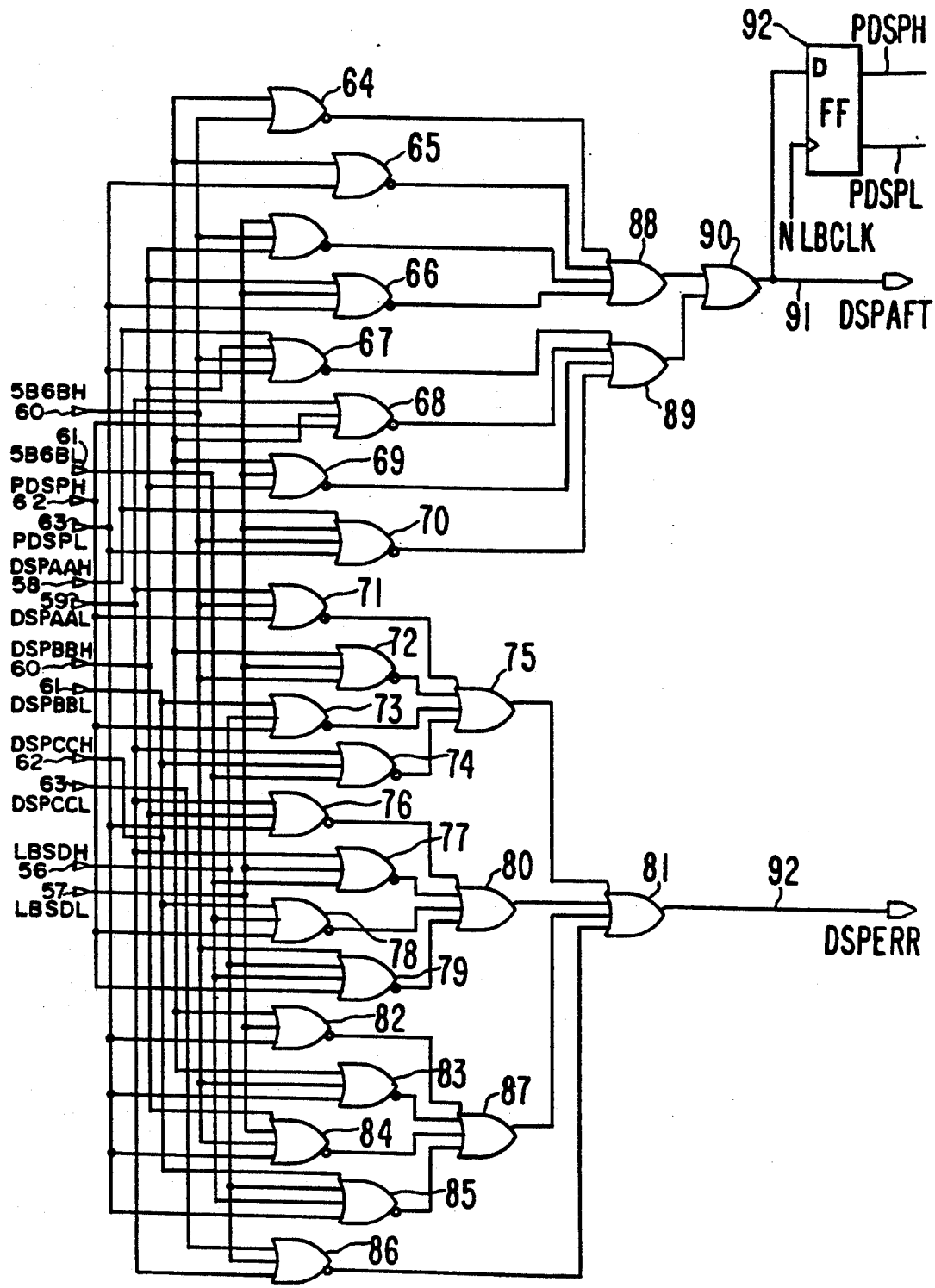
FIG. 5 is the combinatorial logic diagram of the preferred embodiment of the invention.

The logic/truth table for the combinatorial logic of FIG. 5 is shown in FIG. 6. With reference to FIG. 5, since the counter stages output flip flop 21, 42 and 48, FIG. 4 are reset at the end of each nibble, their state is "111" if no "1s" are present in the incoming data stream prior to the last bit. Note that this truth table also considers which nibble is being evaluated, the 3B/4B or 5B/6B nibble, which is the input line 5B6BH,60, and 5B6BL,61 in FIG. 5. With reference to the truth table of FIG. 6, consider the first block, 0', which corresponds to the case where the incoming data has no ones in the nibble. Note that the counter states flip flops A, B, and C are unchanged and at the "1" state. The next column is for the state of the flip flop holding the last bit of serial in data nibble and is called "LBSD." The next column is indicative of which type of nibble is being evaluated and is a logical one if the 5B/6B nibble is being evaluated. The last column, PDSP, stands for the previous running disparity value. The running disparity PDSP is a logical one if running disparity is +1 or a logical zero if the running disparity is −1. It is of interest to note that in the first block, where the state of the counters A, B, and C were unchanged, that the DSPERR column is 1, meaning disparity error conditions are present except for a single case where the last bit is a "1," and the 3B/4B smaller nibble is being evaluated and the running disparity was previously high. This corresponds to a 4 bit code of 0001, which is an allowed 4 bit code if the previous running disparity, PDSP, is high as seen from Table 2.

The DSPAFF signal 91, which stands for "disparity after" the nibble is latched in flip flop 92 at NBCLK. Output of flip flop 92 is sent to the combinatorial logic OR circuit input PDSPH 62 and PDSPL 63 as the previous nibble disparity. The remaining inputs in FIG. 5 to the combinatorial OR circuit are the outputs of counter A flip flop 141, counter B flip flop 142 and counter C flip flop 143 on lines 58–63 respectively.

There are many variations of the present invention in light of the above teachings. It is understood that the scope of our invention is to be defined by the following claims and is not limited to the embodiments disclosed herein.

What is claimed is:

1. In a high speed, serial binary data receiver including a circuit for decoding DC balanced encoded data nibbles and a circuit for verifying running disparity and for flagging erroneous disparity coding of said nibbles of said encoded data, THE IMPROVEMENT COMPRISING, said circuit for verifying running disparity and for flagging improper disparity nibbles including a state device means having a plurality of stages, said state device means for counting the number of ones and zeroes in each said nibble;

a plurality of latches coupled to said state device means to latch the output state of each stage of said state device at the end of each nibble; and combinatorial logic means, said combinatorial logic means being responsive to the latched state of said stages of said state device.

2. The circuit of claim 1 wherein said state device means is a Johnson type counter.

3. The circuit of claim 2 wherein said Johnson type counter is a three stage counter wherein each of said stages includes a MUX coupled to an output register.

4. The circuit of claim 3 wherein each said output register is a resetable flip flop.

5. The circuit of claim 4 including a flip flop to latch the state of the last bit of each serial in data nibble and wherein said combinatorial logic means is also responsive to said latch state of said flip flop indicating whether the last bit of the serial in data nibble being evaluated was high or low.

6. The circuit of claim 5 wherein the said combinatorial logic is also responsive to a nibble type identifier, said nibble type identifier indicating whether the coded nibble is a 5B/6B or 3B/4B packet, and to the running disparity before the nibble being evaluated.

7. A real time method of performing running disparity measurements on and flagging disparity errors in each nibble of incoming data comprising, counting said incoming data stream transitions in a multistage state machine for each nibble;

latching the output state of each stage of said state machine at the end of each nibble;

latching the value of the last bit of the nibble being evaluated; and performing combinatorial logic responsive to the said latched states of said multistage state machine and to said last bit to update said running disparity and to flag a said disparity error, if any.

8. The method of claim 7 wherein said multistage state machine is a Johnson counter having three stages and wherein ones in said incoming data stream cause the first stage of said Johnson counter to change state.

9. The method of claim 8 wherein said second and third stage of said Johnson counter take in the state of the previous stage only on the occurrence of a one in the incoming data stream.

* * * * *